US012565701B2

(12) United States Patent
Hong et al.

(10) Patent No.: US 12,565,701 B2
(45) Date of Patent: Mar. 3, 2026

(54) UNDERCOATING COVERAGE AND RESISTANCE CONTROL FOR ESCS OF SUBSTRATE PROCESSING SYSTEMS

(71) Applicant: LAM RESEARCH CORPORATION, Fremont, CA (US)

(72) Inventors: Tu Hong, Tualatin, OR (US); Chunhai Ji, Portland, OR (US); Pengyi Zhang, Beaverton, OR (US); Niraj Rana, West Linn, OR (US); Feng Bi, Lake Oswego, OR (US); Ming Li, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 18/729,093

(22) PCT Filed: Dec. 13, 2022

(86) PCT No.: PCT/US2022/052713
§ 371 (c)(1),
(2) Date: Jul. 15, 2024

(87) PCT Pub. No.: WO2023/146648
PCT Pub. Date: Aug. 3, 2023

(65) Prior Publication Data
US 2025/0101580 A1        Mar. 27, 2025

Related U.S. Application Data

(60) Provisional application No. 63/304,379, filed on Jan. 28, 2022.

(51) Int. Cl.
*C23C 16/44*        (2006.01)
*C23C 16/02*        (2006.01)
(Continued)

(52) U.S. Cl.
CPC ...... *C23C 16/4404* (2013.01); *C23C 16/0227* (2013.01); *C23C 16/308* (2013.01);
(Continued)

(58) Field of Classification Search
CPC ........... C23C 16/4404; C23C 16/0227; C23C 16/308; C23C 16/401; C23C 16/345; C23C 16/4405
See application file for complete search history.

(56) References Cited

U.S. PATENT DOCUMENTS 6,771,483 B2 * 8/2004 Harada ............... H01L 21/6833
                                                       361/234
11,086,233 B2 * 8/2021 Topping ............. H01L 21/6875
(Continued)

FOREIGN PATENT DOCUMENTS

JP             3271352      * 1/2002    ............. H01L 21/68
JP     2007-129119      * 5/2007    ........... H01L 21/316
(Continued)

OTHER PUBLICATIONS

International Search Report and Written Opinion of the ISA issued in PCT/US2022/052713, mailed Apr. 20, 2023; ISA/KR.

*Primary Examiner* — Bret P Chen

(57)        ABSTRACT

An electrostatic chuck (ESC) undercoating system includes a memory and a controller. The memory stores an undercoat application. The controller configured to execute the undercoat application to: determine undercoat parameters; perform a full clean process to remove undercoat deposits in processing chamber of substrate processing system; and based on the undercoat parameters, perform one or more deposition processes to deposit one or more undercoat layers on the ESC to provide an overall undercoat layer having an overall thickness between 7-15 μm, the one or more under-
(Continued)

coat layers providing protection of the ESC during subsequent deposition processing of a substrate on the ESC.

19 Claims, 8 Drawing Sheets

(51) Int. Cl.

| | |
|---|---|
| *C23C 16/30* | (2006.01) |
| *C23C 16/34* | (2006.01) |
| *C23C 16/40* | (2006.01) |
| *C23C 16/509* | (2006.01) |
| *C23C 16/52* | (2006.01) |
| *H01J 37/32* | (2006.01) |
| *H01L 21/683* | (2006.01) |

(52) U.S. Cl.

CPC .......... *C23C 16/345* (2013.01); *C23C 16/401* (2013.01); *C23C 16/4405* (2013.01); *C23C 16/5096* (2013.01); *C23C 16/52* (2013.01);

*H01J 37/32449* (2013.01); *H01L 21/6833* (2013.01); *H01J 2237/3321* (2013.01)

(56) References Cited

U.S. PATENT DOCUMENTS

| | | | |
|---|---|---|---|
| 2018/0230587 A1 | 8/2018 | Firouzdor et al. | |
| 2020/0058539 A1 | 2/2020 | Rathi et al. | |
| 2020/0185203 A1 | 6/2020 | Lubomirsky et al. | |
| 2021/0333715 A1 * | 10/2021 | Topping | .............. H01L 21/6833 |

FOREIGN PATENT DOCUMENTS

| | | | | |
|---|---|---|---|---|
| JP | 6068438 B2 | | 1/2017 | |
| KR | 10-2007-0030125 | * | 3/2007 | ........... H01L 21/687 |
| WO | WO 01/38600 A1 | * | 5/2001 | ............. C23C 16/00 |
| WO | WO 2011/150311 | * | 12/2011 | ........... H01L 21/683 |

* cited by examiner

UNDERCOATING COVERAGE AND RESISTANCE CONTROL FOR ESCS OF SUBSTRATE PROCESSING SYSTEMS

CROSS-REFERENCE TO RELATED APPLICATIONS

This application is a U.S. National Phase Application under 35 U.S.C. 371 of International Application No. PCT/US2022/052713, filed on Dec. 13, 2022, which claims the benefit of U.S. Provisional Application No. 63/304,379, filed on Jan. 28, 2022. The entire disclosures of the above applications are incorporated herein by reference.

FIELD

The present disclosure relates generally to substrate processing systems and more particularly to electrostatic chucks.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A substrate processing system, such as a plasma enhanced chemical vapor deposition (PECVD) processing system, typically includes a showerhead and a substrate support for supporting a substrate. The substrate support is typically implemented as an electrostatic chuck (ESC). The ESC comprises clamping electrodes to clamp the substrate to the ESC during processing. During operation, the showerhead distributes reactant gas above the substrate. A radio frequency (RF) potential is provided between two electrodes (e.g., the showerhead and an RF electrode in the substrate support) to generate plasma. Energized electrons ionize or dissociate reactant gases from the plasma and create chemically reactive radicals. As these radicals react, a thin film is deposited on the substrate.

SUMMARY

An ESC undercoating system is disclosed and includes a memory and a controller. The memory stores an undercoat application. The controller configured to execute the undercoat application to: determine undercoat parameters; perform a full clean process to remove undercoat deposits in processing chamber of substrate processing system; and based on the undercoat parameters, perform one or more deposition processes to deposit one or more undercoat layers on the ESC to provide an overall undercoat layer having an overall thickness between 7-15 µm. The one or more undercoat layers provide protection of the ESC during subsequent deposition processing of a substrate on the ESC.

In other features, the undercoat parameters include radio frequency power levels, gas flow rates, gas flow pressures, gas species, and durations of deposition processes. In other features, the undercoat parameters include a size of a gap between the electrostatic chuck and a showerhead for each undercoat layer formed during deposition of the one or more undercoat layers. In other features, the full clean process includes supplying ammonia to the processing chamber.

In other features, the one or more undercoat layers include: a first undercoat layer; and a second undercoat layer disposed on the first undercoat layer. In other features, each of the first undercoat layer and the second undercoat layer includes at least one of silicon oxide or silicon nitride. In other features, the first undercoat layer includes silicon oxide and the second undercoat layer includes silicon nitride or silicon oxynitride. In other features, the first undercoat layer and the second undercoat layer include silicon oxide.

In other features, the first undercoat layer includes silicon oxide or silicon oxynitride and the second undercoat layer includes silicon nitride or silicon oxynitride. In other features, the second undercoat layer is thinner than the first undercoat layer.

In other features, the controller is configured to set a size of a gap between the ESC and a showerhead to be greater for deposition of the second undercoat layer than for deposition of the first undercoat layer. In other features, the controller is configured to set a size of a gap between the ESC and a showerhead for deposition of the first undercoat layer and refrain from changing the size of the gap for deposition of the second undercoat layer.

In other features, the one or more undercoat layers include: a first undercoat layer; one or more intermediate undercoat layers disposed on the first undercoat layer; and a last undercoat layer disposed on the one or more intermediate undercoat layers. In other features, the first undercoat layer is formed of silicon oxide or silicon oxynitride. Each of the one or more intermediate undercoat layers and the last undercoat layer is formed of at least one of silicon oxide or silicon nitride.

In other features, the controller is configured to set a size of a gap between the ESC and a showerhead to be greater for deposition of at least one of the one or more intermediate undercoat layers and the last undercoat layer than for deposition of the first undercoat layer.

In other features, the controller is configured to set a size of a gap between the ESC and a showerhead for deposition of the first undercoat layer and refrain from changing the size of gap for deposition of the one or more intermediate undercoat layers and the last undercoat layer.

In other features, the controller is configured to, based on an amount of estimated bowing of a substrate to be processed, set the overall thickness. In other features, the controller is configured to introduce one or more precursors into the processing chamber for deposition of the one or more undercoat layers. The one or more precursors are selected from silane, nitrous oxide and nitrogen.

In other features, a substrate processing system is disclosed and includes: the ESC undercoating system; the processing chamber; a gas delivery system configured to deliver gases to the processing chamber; a radio frequency generating system configured to generate plasma within the processing chamber; and a power supply circuit configured to supply current to the ESC to electrostatically clamp the substrate to the ESC. The controller is configured to: control the gas delivery system and the radio frequency generating system to deposit the one or more undercoat layers on the ESC; and subsequent to forming the one or more undercoat layers on the ESC, perform the deposition processing of the substrate on the ESC.

In other features, a method for forming an overall undercoat layer on an ESC is disclosed. The method includes: determining undercoat parameters; performing a full clean process to remove undercoat deposits in processing chamber of substrate processing system; and based on the undercoat parameters; and performing one or more deposition processes to deposit one or more undercoat layers on the ESC to provide the overall undercoat layer having an overall thickness between 7-15 μm. The one or more undercoat layers provide protection of the ESC during subsequent deposition processing of a substrate on the ESC.

In other features, the undercoat parameters include radio frequency power levels, gas flow rates, gas flow pressures, gas species, and durations of deposition processes. In other features, the undercoat parameters include a size of a gap between the electrostatic chuck and a showerhead for each undercoat layer formed during deposition of the one or more undercoat layers. In other features, the full clean process includes supplying ammonia to the processing chamber.

In other features, the one or more undercoat layers include: a first undercoat layer; and a second undercoat layer disposed on the first undercoat layer. In other features, each of the first undercoat layer and the second undercoat layer includes at least one of silicon oxide or silicon nitride. In other features, the first undercoat layer and the second undercoat layer include silicon oxide. In other features, the first undercoat layer includes silicon oxide or silicon oxynitride. The second undercoat layer includes silicon nitride or silicon oxynitride. In other features, the first undercoat layer includes silicon oxide and the second undercoat layer includes silicon nitride or silicon oxynitride.

In other features, the second undercoat layer is thinner than the first undercoat layer. In other features, the method further includes setting a size of a gap between the electrostatic chuck and a showerhead to be greater for deposition of the second undercoat layer than for deposition of the first undercoat layer. In other features, the method further includes setting a size of a gap between the electrostatic chuck and a showerhead for deposition of the first undercoat layer and refrain from changing the size of the gap for deposition of the second undercoat layer.

In other features, the one or more undercoat layers include: a first undercoat layer; one or more intermediate undercoat layers disposed on the first undercoat layer; and a last undercoat layer disposed on the one or more intermediate undercoat layers. In other features, the first undercoat layer is formed of silicon oxide or silicon oxynitride. Each of the one or more intermediate undercoat layers and the last undercoat layer is formed of at least one of silicon oxide or silicon nitride.

In other features, the method further includes setting a size of a gap between the electrostatic chuck and a showerhead to be greater for deposition of at least one of the one or more intermediate undercoat layers and the last undercoat layer than for deposition of the first undercoat layer. In other features, the method further includes setting a size of a gap between the electrostatic chuck and a showerhead for deposition of the first undercoat layer and refrain from changing the size of gap for deposition of the one or more intermediate undercoat layers and the last undercoat layer.

In other features, the method further includes, based on an amount of estimated bowing of a substrate to be processed, selecting the overall thickness. In other features, the method further includes introducing one or more precursors into the processing chamber for deposition of the one or more undercoat layers, where the one or more precursors are selected from silane, nitrous oxide and nitrogen.

In other features, a substrate deposition method is disclosed and includes: the method for forming an overall undercoat layer on an ESC; supplying current to the ESC to electrostatically clamp the substrate to the ESC; controlling a gas delivery system and a radio frequency generating system to deposit the one or more undercoat layers on the ESC; and subsequent to forming the one or more undercoat layers on the ESC, performing the deposition processing of the substrate on the ESC.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
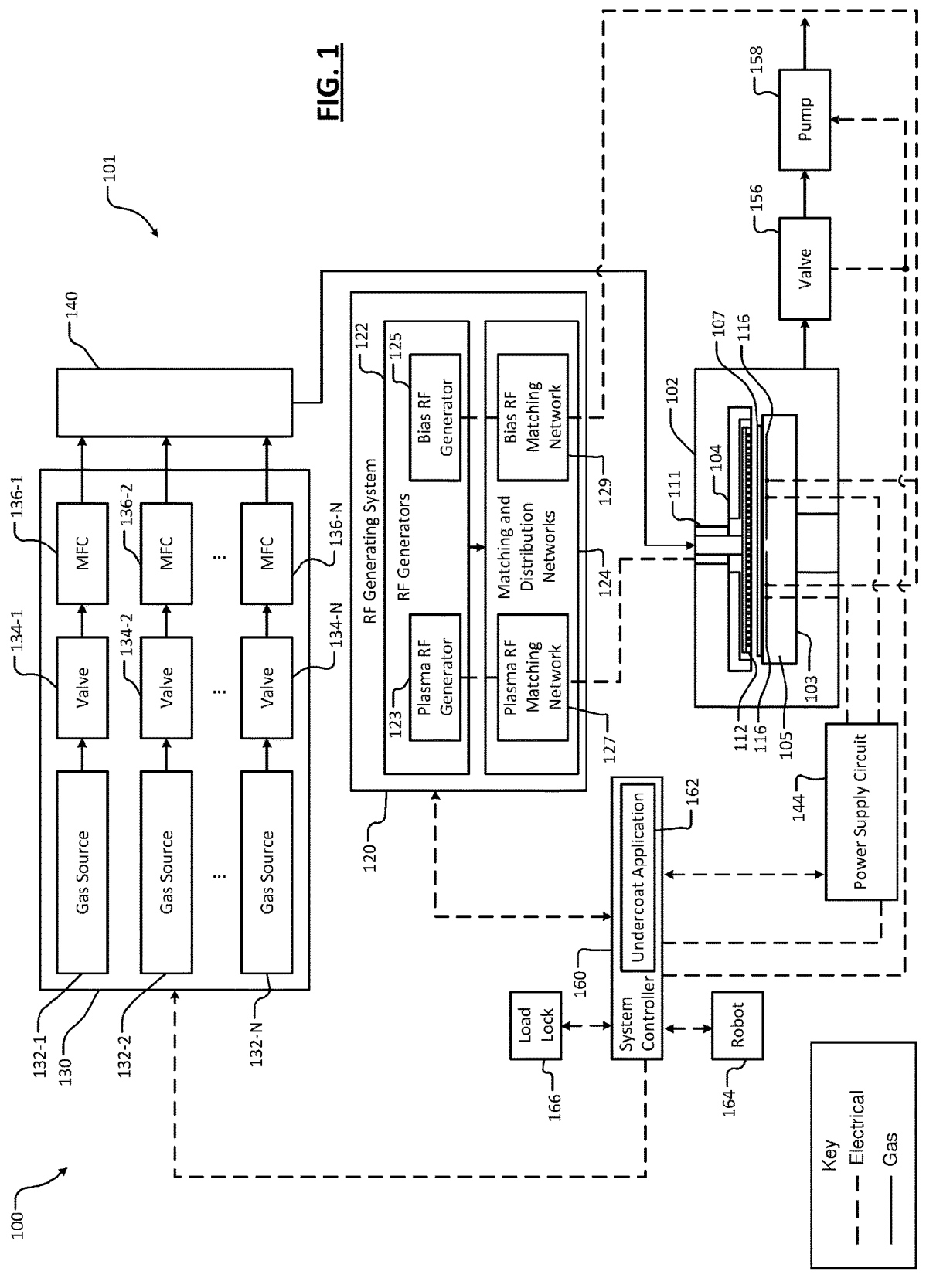
FIG. 1 is a functional block diagram of an example of a substrate processing system including an undercoating system in accordance with an embodiment of the present disclosure.

Components within a processing chamber of a substrate processing system are exposed to severe operating conditions. The components include showerheads and ESCs. The components are exposed to various process chemistries, high direct current (DC) voltages (e.g., 700-1000 V), high alternating currents (AC), high radio frequency (RF) power levels (e.g., 10-15 kilowatts (KW), and high temperatures (e.g., 600-700° C.). Exposure to such harsh chemical, electrical, and thermal conditions tends to degrade and damage the components.

To prevent damage to components within a processing chamber, a protective layer, referred to as an "undercoat layer" is deposited on chamber walls and internal components. In addition to providing protection, the undercoat layer also provides other benefits, such as aiding adhesion of material (e.g., carbon film) deposited during deposition cycles and preventing film deposition drifting issues. Without the undercoat layer, poor adhesion can occur during deposition, and particles of deposited material can end up on and damage the substrate being processed. Film deposition drifting includes variations in deposited film thicknesses.

During substrate processing, the undercoat layer on the chamber components degrades. This is especially true for the showerhead and ESC. For this reason, a full clean process is performed periodically to remove remaining portions of the undercoat layer on the chamber components and a new undercoat layer is redeposited on the chamber components. As an example, a full clean process may be performed after each set (or batch) of deposition cycles (e.g., 100 deposition cycles per set), where each cycle includes performing a deposition process for a respective substrate.

During deposition, a substrate can be electrostatically clamped to a bipolar ESC. The bipolar ESC includes two clamping electrodes: a first electrode that receives a first voltage (e.g., 700 V direct current (DC)) and a second electrode that receives a second voltage (e.g., −700V DC). The electrodes can be 'D'-shaped. Current is passed from the first electrode to the substrate disposed on the ESC and then back from the ESC to the second electrode. A small percentage (e.g., less than 30%) of the total amount of current supplied to the first electrode is (i) referred to as electrostatic clamping current or functional ESC current, and (ii) flows vertically from the first electrode to the substrate and vertically back from the substrate to the second electrode. The electrostatic clamping current holds the substrate on the ESC and prevents movement of the substrate relative to the ESC. A large percentage of the total amount of current flow supplied to the first electrode is (i) referred to as leakage D-to-D current or non-functional ESC current, and (ii) flows laterally through a portion of the ESC disposed between the electrodes without flowing to the substrate.

Bipolar ESCs can suffer from a high rate of failure at high-temperatures due to exposure to aluminum fluoride (AlFx) and ESC clamping current. During a full clean process, an ESC can be cleaned with nitrogen trifluoride (NF$_3$). The ESC may be formed of aluminum nitride (AlNx) and when exposed to NF$_3$, a surface of the ESC can be transformed into aluminum fluoride (AlFx). During substrate processing, the AlFx is further driven into the body of the ESC due to the ESC clamping current. AlFx is attracted to the charge of the ESC associated with the electrostatic clamping current, and more particularly is driven into microcontact areas (MCAs) which protrude upward from a body of the ESC. The exposure to AlFx causes granular degradation and changes the surfaces of the MCAs. This can negatively affect charge balance of the ESC and electrostatic clamping of substrates. Charge balance of the ESC refers to differences in charge levels of bipolar ESC electrodes. The root cause of ESC failures can be associated with high charge imbalance and/or high ESC clamping current.

When charge imbalance exists in the ESC, current can flow unexpectedly between the ESC, which is at a high-voltage potential, to the showerhead that is at a low-voltage potential (or grounded). As a result, arcing can occur in holes of the showerhead during deposition, which degrades the showerhead and creates metal balls that drop from the showerhead onto the substrate being processed resulting in cluster defects. Cluster defects refer to a large number of metal balls falling from a certain area of the showerhead onto the substrate. It has been determined unexpectedly that the showerhead is not the root cause of the cluster defects, but rather is due to charge imbalance in the ESC and presence of AlFx.

As an example, an undercoat layer can be applied in two steps. The first step includes primarily covering certain chamber components, such as a showerhead and an ESC. The second step includes primarily covering remote areas and components other than the showerhead and the ESC. The other components may include chamber walls, an ESC spindle, etc. Traditionally, the undercoat layer has been designed for proper adhesion. For example, the total thickness of the undercoat layer on the ESC after the two-step process has been set to satisfy adhesion requirements. To satisfy adhesion requirements, the total thickness can be 5 micrometers (µm). An undercoat layer of this thickness can satisfy adhesion requirements and is adequate for new substrate supports and low-temperature applications (e.g., 200-400° C. applications). However, in high-temperature applications degradation of the undercoat layer and insufficient undercoat coverage on pedestal due to loss in grain of MCAs can increase the amount of charge imbalance.

Charge balance of bipolar electrodes of a new ESC can be slightly asymmetrical and become more asymmetrical over time. This can be due to degradation of the MCAs and in turn result in increased attraction of AlFx to the MCAs for further degradation of the MCAs. The degradation of the undercoat layer and the MCAs can cause cluster defects. In addition, the ability of reapplications of the undercoat layer to properly cover the MCAs decreases over time, which results in additional arcing and cluster defects. This is due to the surfaces of the MCAs becoming rough and having more and more imperfections over time.

The examples set forth herein include an undercoating system and methods for forming undercoat layers with increased thickness and resistivity and improved coverage and smoothness characteristics. The undercoat layers are applied on internal chamber components including ESCs. The undercoat layers satisfy ESC clamping force requirements while providing ESC protection and thus showerhead protection. The undercoat layers provide micro-level coverage including filling in granular level imperfections in ESC surfaces to provide smooth outer surfaces for improved MCA surface-to-wafer surface contact and improved step coverage. Step coverage refers to coverage of top and side surfaces of MCAs. The step coverage may be a ratio between (i) a thickness of an undercoat layer on a top surface of an MCA and (ii) a thickness of an undercoat layer on a sidewall of the MCA. The stated coverage improves clamping attraction of substrates and prevents scratching of substrates during placement and ESC clamping of the substrates.

The undercoat layers provide improved insulation to prevent and/or minimize the amount that ESC clamping current increases over numerous deposition cycles. The undercoat layers also aid in retaining adequate ESC clamping forces over the numerous deposition cycles. By implementing the undercoat methods disclosed herein, lifetime of ESCs is increased and arcing is prevented or reduced resulting in significantly reduced rates of cluster defects.

FIG. 1 shows a substrate processing system 100 including an undercoating system 101 that applies an undercoat layer on internal components of a processing chamber 102 including on an ESC 103 and a showerhead 104. Although FIG. 1 shows a capacitive coupled plasma (CCP) system, the embodiments disclosed herein are applicable to transformer coupled plasma (TCP) systems, inductively coupled plasma (ICP) systems and/or other systems and plasma sources that include a showerhead, which may be heated. The embodiments are applicable to high temperature PECVD processes and may be applicable to high temperature PEALD processes and high temperature chemically enhanced plasma vapor deposition (CEPVD) processes.

Although the ESC 103 and the showerhead 104 are shown as including a particular structure, the ESC 103 and the showerhead 104 may have other structures. For example, although the ESC 103 is shown having a monolithic body 105, the ESC 103 may include multiple plates. The showerhead 104 may include multi-plate and/or stacked layer arrangements. In one embodiment, the ESC 103 is formed of AlNx and the showerhead 104 is formed of aluminum (Al).

The ESC 103 and the showerhead 104 are enclosed within the processing chamber 102. The processing chamber 102 may contain RF plasma. During operation, a substrate 107 is arranged on and electrostatically clamped to the ESC 103. The showerhead 104 introduces and distributes gases. The showerhead 104 may include a stem portion 111 including one end connected to a top surface of the processing chamber 102. The showerhead 104 is generally cylindrical and extends radially outward from an opposite end of the stem portion 111 at a location that is spaced from the top surface of the processing chamber 102. A substrate-facing surface of the showerhead 104 includes holes through which process or purge gas flows.

An RF generating system 120 generates and outputs RF voltages to one or more upper electrodes 112 in the showerhead 104 and/or lower (or bipolar) electrodes 116 in the ESC 103. The upper electrodes 112 may be DC grounded, AC grounded or at a floating potential. For example only, the RF generating system 120 may include one or more RF generators 122 (e.g., a capacitive coupled plasma RF power generator, a bias RF power generator, and/or other RF power generator) that generate RF voltages, which are fed by one or more matching and distribution networks 124 to the upper electrodes 112 and/or the lower electrodes 116. As an example, a plasma RF generator 123, a bias RF generator 125, a plasma RF matching network 127 and a bias RF matching network 129 are shown. The plasma RF generator 123 may be a low-power and/or high-power RF generator producing, for example 100 watts (W) to 15 kilowatts (KW) of power. The bias RF matching network 129 supplies power to RF electrodes, such as electrodes 116.

A gas delivery system 130 includes one or more gas sources 132-1, 132-2, . . . , and 132-N (collectively gas sources 132), where N is an integer greater than zero. The gas sources 132 supply one or more precursors and gas mixtures thereof. The gas sources 132 may also supply deposition gas, carrier gas and/or purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 104.

A power supply circuit 144 may provide power, including a high voltage, to electrodes 116 to electrostatically clamp the substrate 107 to the ESC 103. Although RF voltages and the electrostatic clamping voltages are shown as being applied to the same electrodes 116, the RF voltages may be supplied to other electrodes included in the ESC 103. The power supply circuit 144 may be controlled by the system controller 160. As an example, the power supply circuit 144 may apply a first DC voltage (e.g., 700V) to a first one of the electrodes 116 and a second DC voltage (e.g., 700V) to a second one of the electrodes 116.

A valve 156 and the pump 158 may be used to evacuate reactants from the processing chamber 102. The system controller 160 may control components of the substrate processing system 100 including controlling supplied RF power levels, pressures and flow rates of supplied gases, RF matching, etc. The system controller 160 controls states of the valve 156 and the pump 158. A robot 164 may be used to deliver substrates onto, and remove substrates from, the ESC 103. For example, the robot 164 may transfer substrates between the ESC 103 and a load lock 166. The robot 164 may be controlled by the system controller 160. The system controller 160 may control operation of the load lock 166. The valves, gas pumps, power sources, RF generators, etc. referred to herein may be referred to as actuators.

Figure 2:
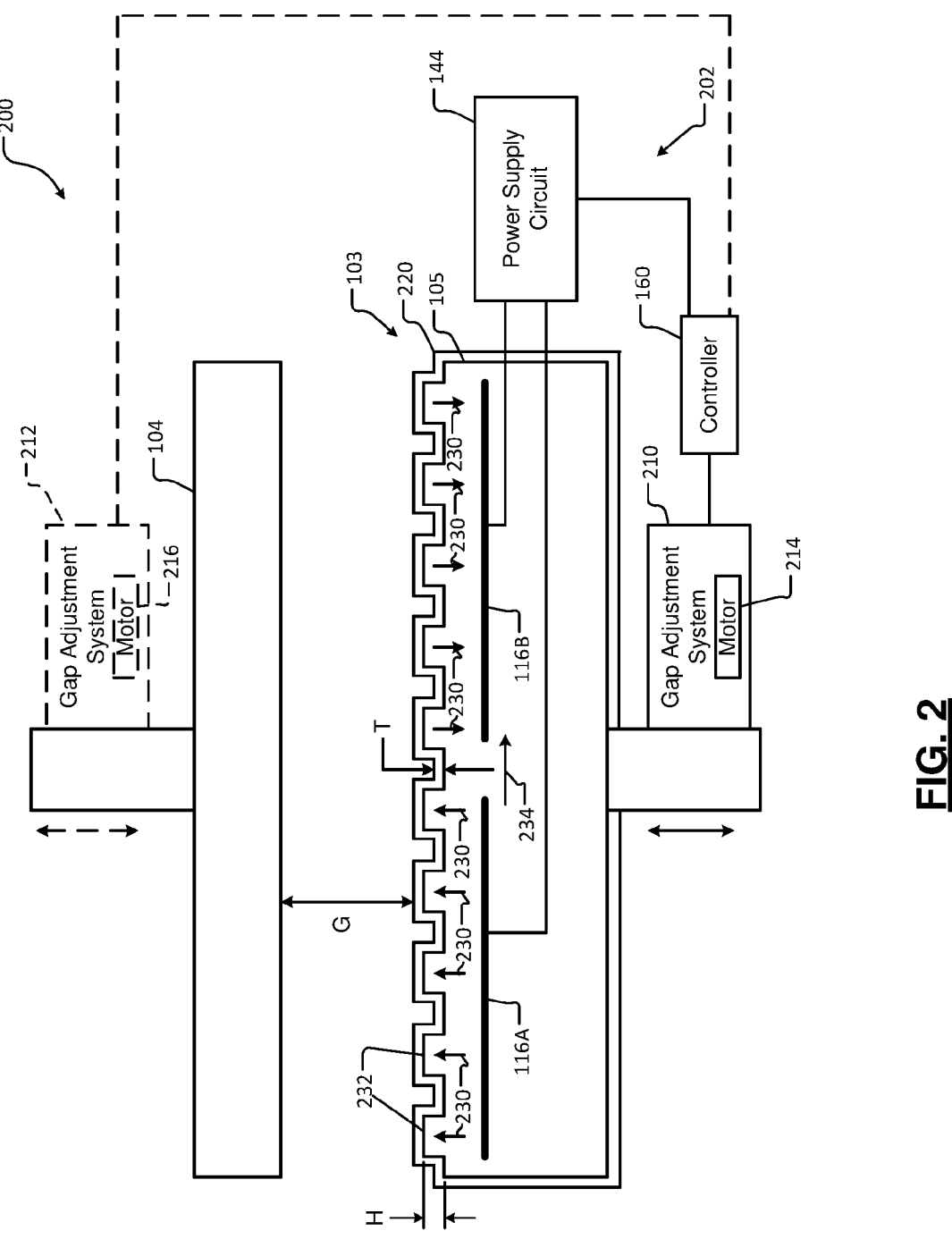
FIG. 2 is a functional block diagram of a portion of the substrate processing system of FIG. 1 including a portion of the undercoating system illustrating an undercoat layer in accordance with the present disclosure.

The undercoating system 101 may include the ESC 103, the RF generating system 120, the gas delivery system 130, the power supply circuit 144, a gap adjustment system (examples of which are shown in FIG. 2) and the system controller 160. The controller 160 may execute an undercoat application 162 to apply undercoat layers to chamber components. This may include applying one or more undercoat layers during an undercoat operation. This is further described below with respect to FIGS. 2-7.

FIG. 2 shows a portion 200 of substrate processing system 100 including a portion 202 of the undercoating system 101 of FIG. 1. The portion 200 includes the ESC 103 and the showerhead 104. The portion 202 includes the ESC 103, the power supply circuit 144, the controller 160 and a gap adjustment system 210. The gap adjustment system 210 may be configured to move the ESC 103 relative to the showerhead 104. In another implementation the gap adjustment system 210 is replaced by a gap adjustment system 212, which is configured to move the showerhead 104 relative to the ESC 103. The gap adjustment systems 210, 212 may include one or more motors (motors 214, 216 are shown) and other actuation components for moving the ESC 103 or the showerhead 104.

The controller 160 may control the gap adjustment system 210 or 212 to set a gap G between the ESC 103 and the showerhead 104 and control the gas delivery system 130 of FIG. 1 to form undercoat layers on the ESC 103. Although the showerhead 104 is not shown having an undercoat layer, an undercoat layer is also formed on the showerhead 104. Although a single overall undercoat layer 220 is shown on the body 105 of the ESC 103, the overall undercoat layer 220 may include one or more undercoat layers. An overall thickness T of the overall undercoat layer 220 is shown. The overall undercoat layer 220 is a protective dielectric layer and may be referred to as a chamber preparation layer formed prior to performing substrate processing.

Figure 3:
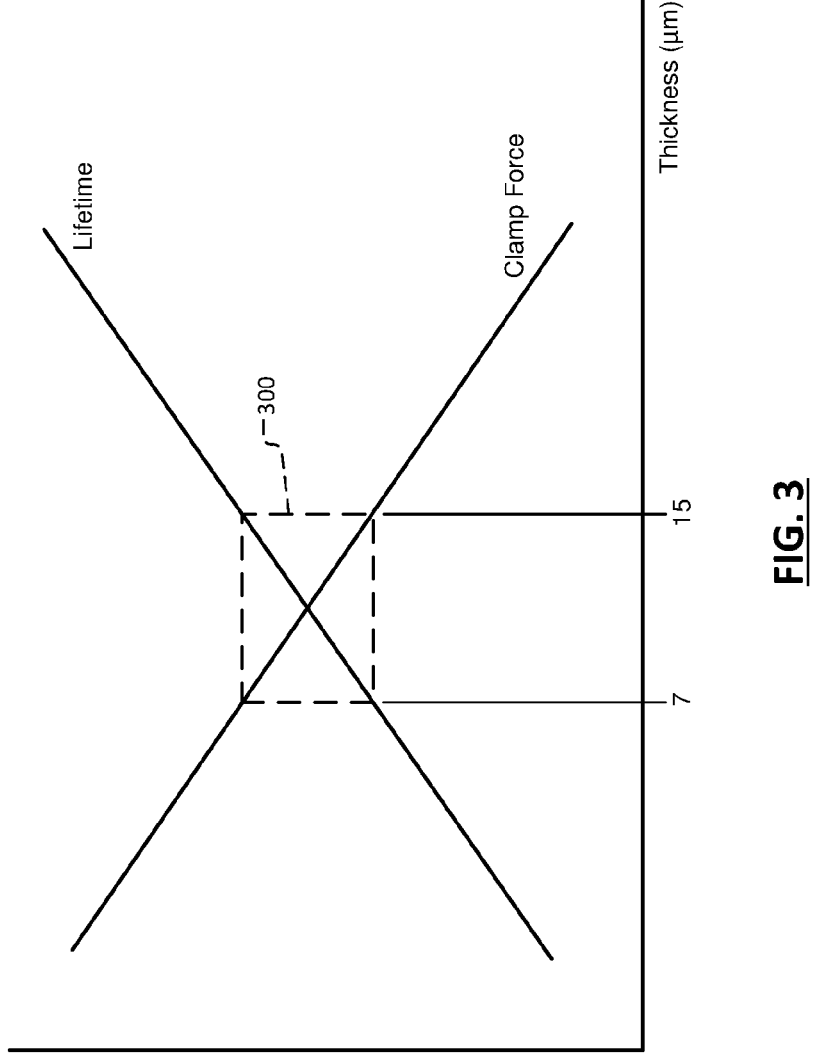
FIG. 3 is a plot illustrating a trade-off relationship between ESC lifetime and ESC clamping force based on changes in thickness of an undercoat layer of an ESC.

FIG. 3 shows a plot illustrating a trade-off relationship between ESC lifetime and ESC clamping force based on changes in thickness of an undercoat layer (or protective dielectric layer) of an ESC. As the thickness increases, the lifetime of the ESC increases, however the resistivity also increases. As the resistivity increases, the ESC clamping force decreases. When the ESC clamping force decreases below a threshold, a substrate may shift or move during processing. As an example, when the thickness T of the undercoat layer exceeds a maximum thickness, there is no longer adequate ESC clamping force to prevent movement of the substrate. Decreasing the thickness of the undercoat layer, decreases ESC resistivity and thus increases ESC clamping force. When the thickness T of the undercoat layer is less than a minimum thickness, then a degradation rate of the ESC increases and lifetime of the ESC drops to an unacceptable level. The undercoat thickness T may thus be set in the range between the minimum thickness and the maximum thickness. An example range is represented by dashed box 300.

As an example, for the ESC clamping voltage ranges of 650-750 and −650-750, the undercoat thickness T may be set between a minimum thickness of 7 $\mu m\pm0.05$ $\mu m$ and a maximum thickness of 15 $\mu m\pm0.05$ $\mu m$. It has been determined that degradation increases substantially when the thickness T of the overall undercoat layer is less than 7 $\mu m\pm0.05$ $\mu m$. It has also been determined that the ESC clamping force becomes unacceptable when the thickness T of the overall undercoat layer is greater than 15 μm±0.05 μm. The thickness of an undercoat layer may be the same across the body of the ESC. The minimum and maximum thicknesses may be determined by the controller 160 of FIG. 1 based on the voltages applied to the ESC clamping electrodes (e.g., the electrodes 116 of FIG. 1). The voltages applied are directly related to the amount of ESC clamping current. The thickness of the undercoat layer may be set based on an amount of bowing of a substrate, as further described below.

Referring again to FIG. 2, the controller 160 may perform undercoat tuning by adjusting one or more parameters, such as RF power, gas flow rates and/or pressures, gap size between the showerhead and the ESC, deposition time, etc. the parameters may be adjusted to improve coverage, improve mechanical and electrical properties of the ESC, and prevent particle formation and arcing. Each of these parameters may be adjusted to adjust a resultant thickness of an undercoat layer. The gas species supplied during formation of each undercoat layer may also be changed to adjust thickness, resistivity, and/or coverage characteristics.

Figure 4:
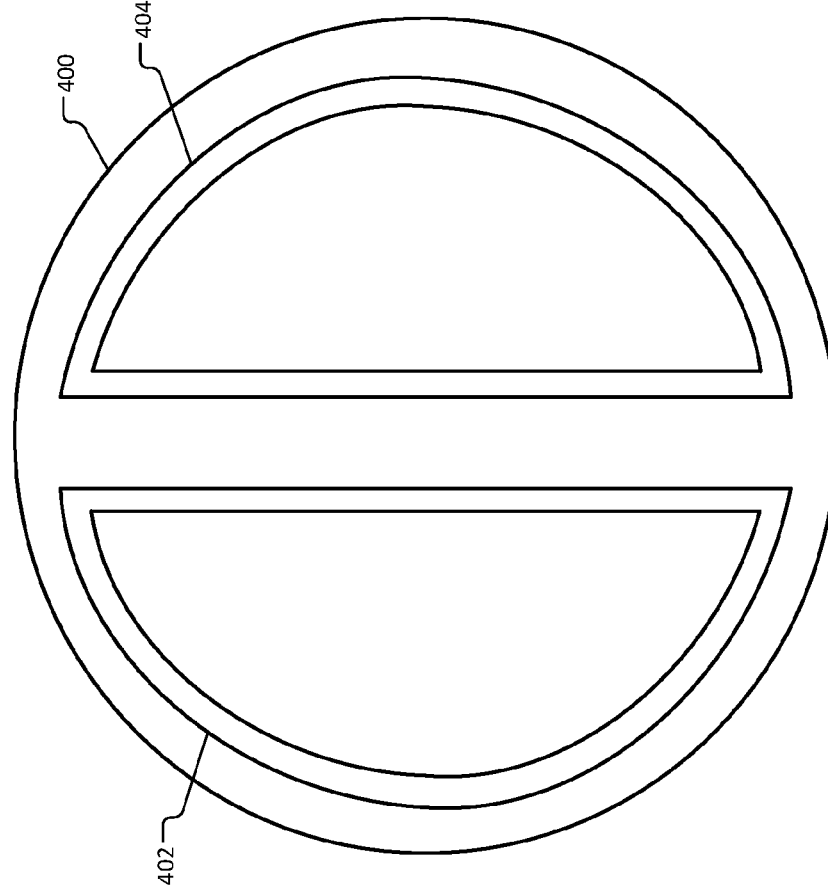
FIG. 4 is a top cross-sectional view of an example bipolar ESC including 'D'-shaped electrodes.

The controller 160 may also control the power supply circuit 144 to provide set voltages (e.g., 700V, –700V) on ESC clamping electrodes 116A, 116B (collectively electrodes 116) during deposition on a substrate (not shown in FIG. 2). FIG. 4 shows a bipolar ESC 400 including 'D'-shaped electrodes 402, 404. The electrodes 116 of FIGS. 1-2 may be implemented as the 'D'-shaped electrodes 402, 404. Referring again to FIG. 2, electrostatic camping current is represented by arrows 230, which is provided through MCAs 232. The height H of the MCAs may be the same or vary depending on the application. As an example, the height H of the mesas may be 20 μm. As another example, the heights of the MCAs may increase with radial distance from a center of the body 105. A non-functional current that passes between the electrodes 116 is represented by arrow 234.

As an example, 2-10% of the total amount of current supplied to the electrodes 116 may provide the ESC clamping current represented by arrows 230 and 90-98% of the total amount of current may flow from the electrode 116A to the electrode 116B as non-functional current.

Figure 5:
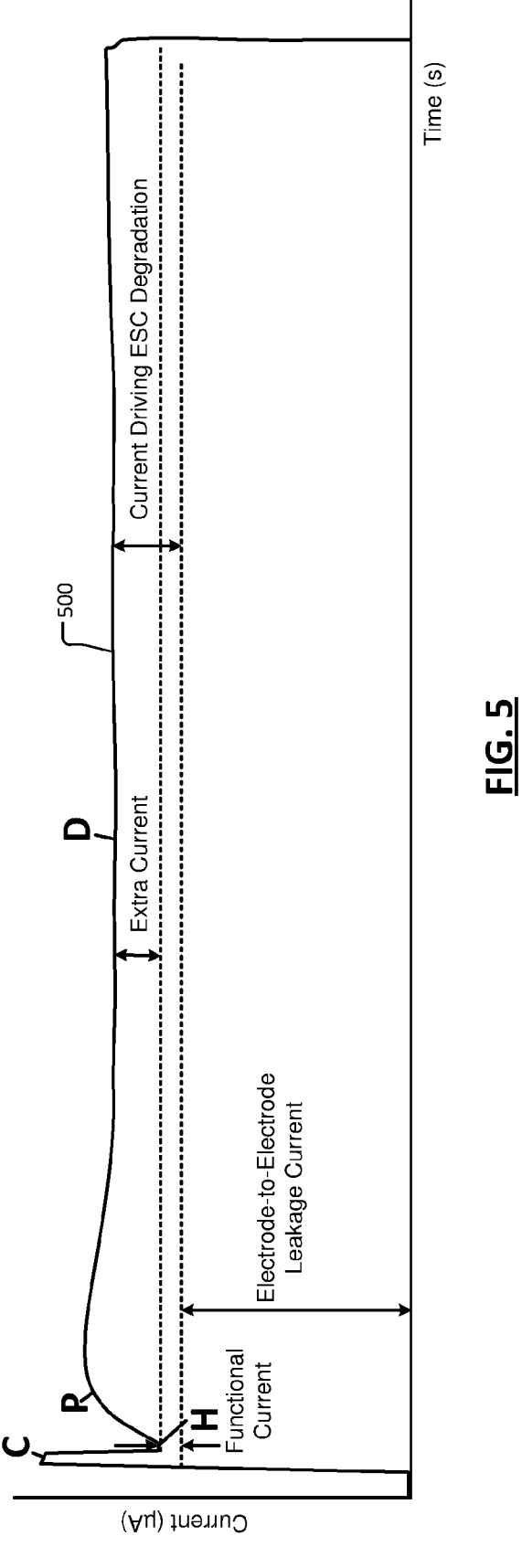
FIG. 5 is an example plot of total ESC current.

FIG. 5 shows a plot of total ESC current represented by curve 500 for an ESC clamping period associated with a deposition process of a substrate. The plot shows examples of process steps that are typically performed on the substrate. The process steps are performed sequentially. In a clamping step C, a peak voltage is applied to the clamping electrodes. In a hold step H, the voltage applied to the clamping electrodes is reduced to hold the substrate clamped to an ESC (e.g., the ESC 103 of FIGS. 1-2). In step P, one or more process gases are supplied through a showerhead (e.g., the showerhead 104 of FIGS. 1-2). In step D, plasma is struck by applying RF power across the showerhead and the ESC, and material is deposited on or removed from the substrate. Step D is typically longer than steps C, H, and P.

The plot illustrates an amount of leakage D-to-D current and a minimum amount of functional current that may be provided when there is no plasma and no gas species being deposited. The plot further shows an amount of extra current being supplied for an ESC having a traditional undercoat layer and plasma and gas species to be deposited being present. It is the extra current that can cause ESC degradation.

Figure 6:
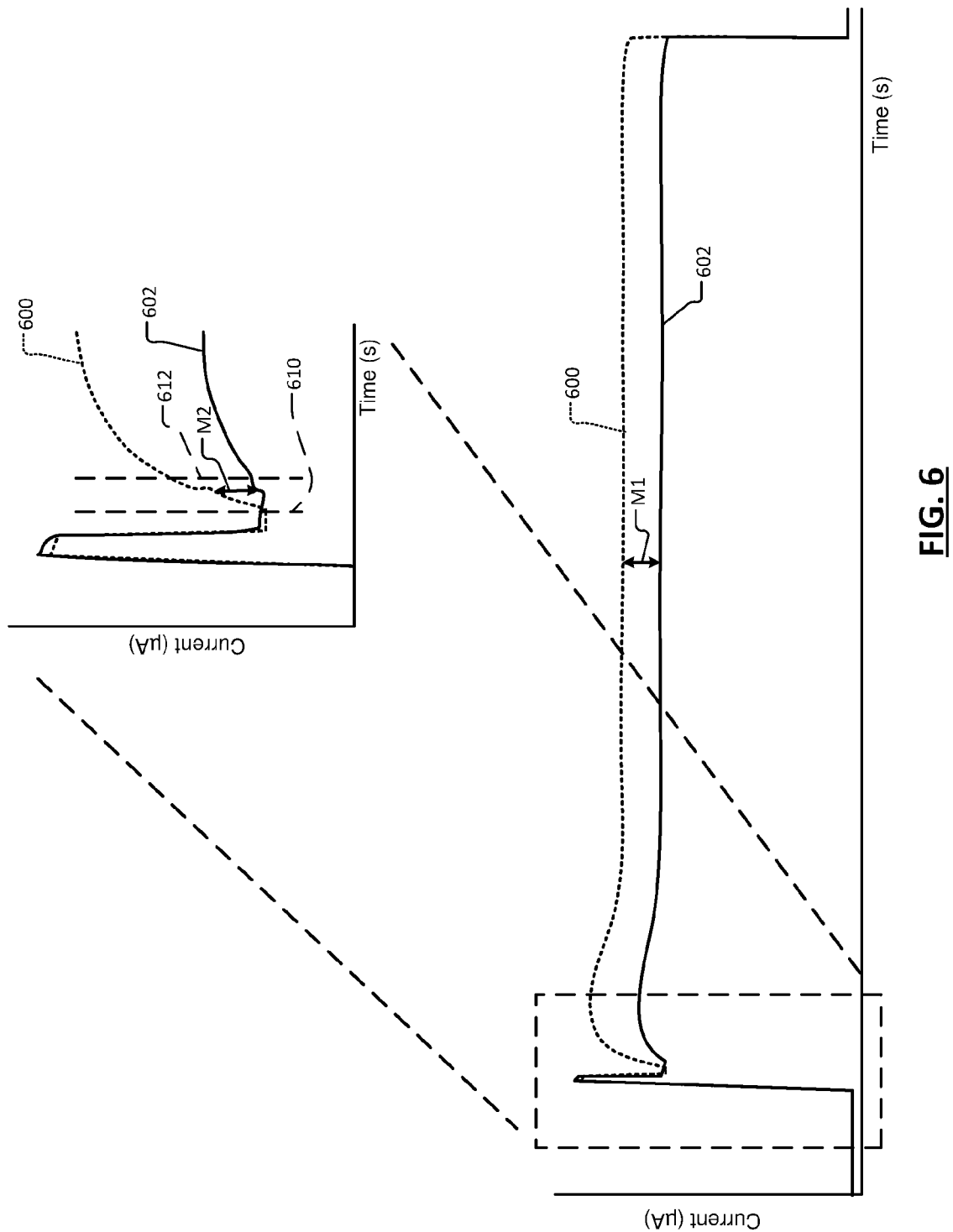
FIG. 6 is a plot of a total ESC current for an ESC including a traditional undercoating layer versus a total ESC current for an ESC including an undercoating layer in accordance with the present disclosure.

FIG. 6 shows a plot of a total ESC current for an ESC (referred to as the traditional ESC) including a traditional undercoat layer versus a total ESC current for an ESC (referred to as the disclosed ESC) including an undercoat layer formed using the methods described herein. The total ESC current for the traditional ESC is represented by curve 600. The total ESC current for the disclosed ESC is represented by curve 602. As can be seen from the plot, the total amount of current supplied to the disclosed ESC (shown by curve 602) is less than the total amount of current supplied to the traditional ESC (shown by curve 600). The is represented by the double arrow M1. Also, the current does not jump and/or substantially increase during the hold step for the disclosed ESC, as does the traditional ESC. See, for example, the time period between vertical dashed lines 610, 612 and the difference represented by double arrow M2. This reduced and steadier amount of current, as shown, during hold, process gas supply and plasma striking periods, provides improved coverage of deposited undercoat species on ESC surfaces and results in increased resistivity of the ESC.

Figure 7:
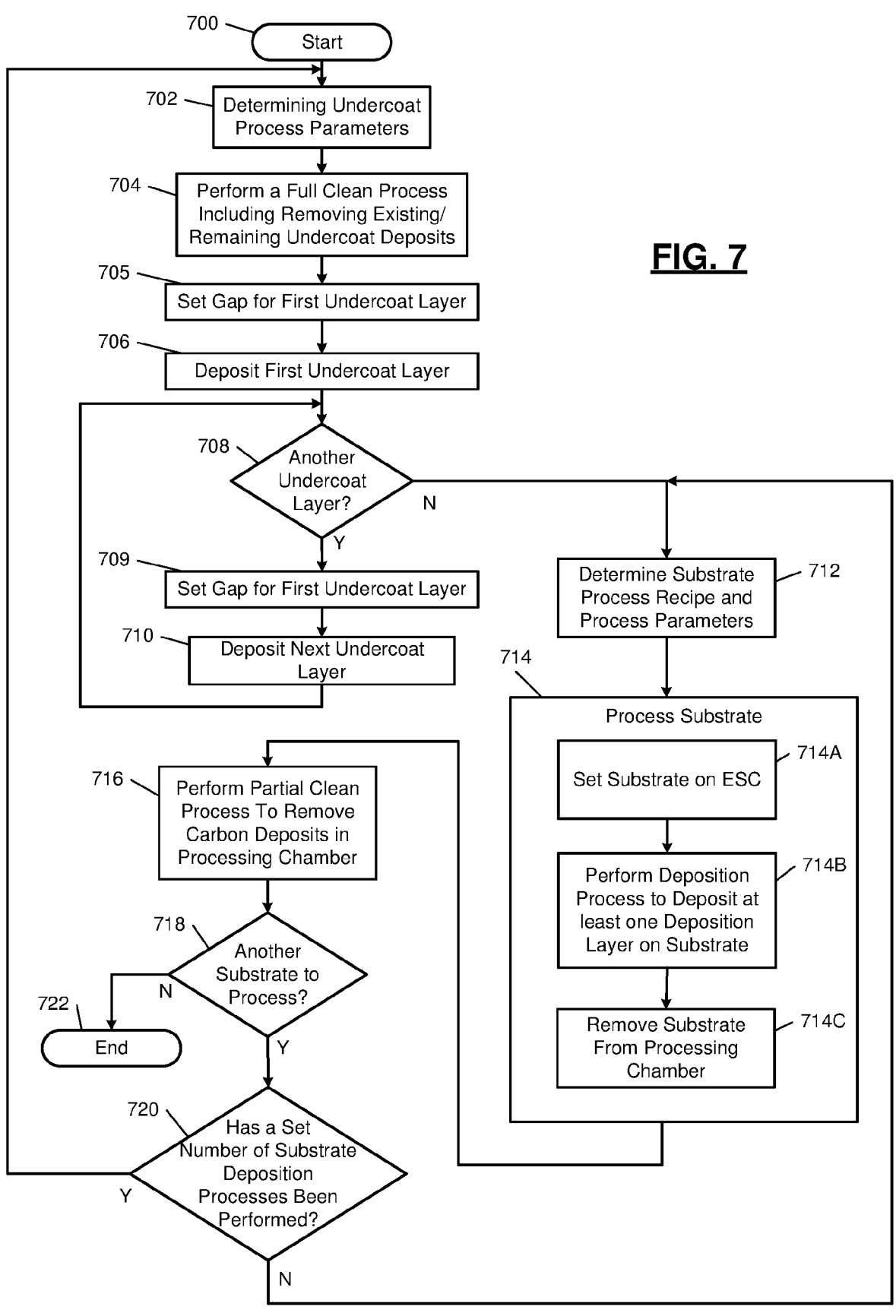
FIG. 7 illustrates an example substrate processing method including an ESC undercoating method in accordance with the present disclosure.

FIG. 7 shows an example substrate processing method including an ESC undercoating method. The ESC undercoating method includes operations 702, 704, 706, 708, 710, 716, 718, 720. The following operations may be iteratively performed. The method may begin at 700. At 702, the controller 160 determines undercoat process parameters. This may include, for each of the undercoat layer deposition operations 706, 710: determining RF power levels; determining gas flow rates and/or pressures; determining size of the gap G between the showerhead 104 and the ESC 103; species chemistries being provided; and deposition times. The RF power levels, gas flow rates, pressures, sizes of the gap G, species chemistries, and deposition times for operations 706, 710 may be the same or different. The RF power levels, gas flow rates, pressures, sizes of the gap G, species chemistries, and deposition times for each iteration of operation 710 may be the same or different for each iteration of the ESC undercoating method and/or cycle through operations 702, 704, 705, 706, 708, 709, 710, 712 for a set of substrate deposition processes. The undercoat process parameters may also include a number of undercoat layers to be formed during a cycle through of operations 706, 710 for a set of substrate deposition processes. The number of undercoat layers may be one or more.

At 704, the controller 160 controls operation of the gas delivery system 130 and performs a full clean process including removing any existing and/or remaining undercoat layer deposits previously formed. During this operation, a substrate is not located on the ESC 103. A cleaning species, such as ammonia ($NH_3$), is supplied to the inside of the processing chamber 102.

At 705, the controller 160 controls one of the gap adjustment systems 210, 212 to set the gap G between the showerhead 104 and the ESC 103 for a first undercoat layer. The gap G may be set at a first gap for operation 705 that places the ESC 103 close to the showerhead 104 to primarily coat the ESC 103 and the showerhead 104 with the first undercoat layer.

At 706, the controller 160 controls operation of the gas delivery system 130 and the RF generating system 120 and deposits the first undercoat layer primarily on the ESC 103 and the showerhead 104. In one embodiment, one or more precursors are introduced into the processing chamber 102 to form a dielectric material layer on the ESC 103 and the showerhead 104. The precursors may include silane ($SiH_4$), nitrous oxide ($N_2O$), nitrogen ($N_2$), and/or other suitable precursors. The dielectric material (or first undercoat) layer may include silicon oxide (SiOx), silicon nitride (SiNx), silicon oxynitride (SiON), and/or other high-resistive dielectric materials. SiOx may be formed to provide improved coverage. SiNx may be formed to provide an undercoat layer with increased resistivity. In an embodiment, $SiH_4$ is introduced in combination with one or more of $N_2O$ and $N_2$. In another embodiment, $SiH_4$, $N_2O$ and $N_2$ are introduced. A higher percentage of $N_2O$ may be supplied, by weight or volume of a total amount of gas supplied to the processing chamber 102, when a SiOx undercoat layer is formed. A higher percentage of $N_2$ may be supplied, by weight or volume of a total amount of gas supplied to the processing chamber 102, when a SiNx undercoat layer is formed. The controller 160 may adjust the percentages of $N_2O$ and $N_2$ to adjust the resistivity and/or smoothness characteristics of the resultant undercoat layer.

In one embodiment, the first undercoat layer is formed of SiOx and a subsequent undercoat layer is formed of SiOx. In another embodiment, the first undercoat layer is formed of SiOx and a subsequent undercoat layer is formed of SiNx. SiOx provides better coverage than SiNx. SiNx is more resistive than SiOx.

At 708, the controller 160 determines whether another undercoat layer is to be formed. If yes, operation 710 is performed, otherwise operation 712 is performed. At 709, the controller 160 controls one of the gap adjustment systems 210, 212 to set the gap between the showerhead 104 and the ESC 103 for a next undercoat layer. In an embodiment, a total of two undercoat layers are deposited on chamber components including the ESC 103 and the showerhead 104. The first undercoat layer is deposited at 706 and the second is deposited at 710. The gap G for the second undercoat layer may be larger than the gap G for the first undercoat layer. In an embodiment, the gap G is the same for the first and second undercoat layers. The gap G may be increased for the second undercoat to, for example, primarily cover chamber components other than the ESC 103 and the showerhead 104.

Figure 8:
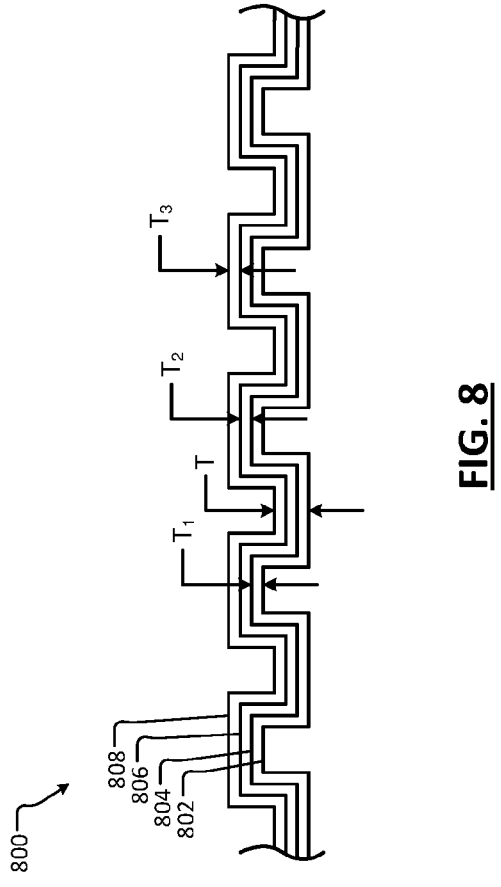
FIG. 8 is a cross-sectional view of a portion of an ESC including multiple undercoat layers in accordance with the present disclosure.

In another embodiment, three or more undercoat layers are deposited on chamber components. An example of an ESC including three undercoat layers is shown in FIG. 8. The gap G for the second (or first intermediate) undercoat layer and/or other intermediate undercoat layers may be the same as or different from the gap G for the first undercoat layer. The gap G for a final undercoat layer may be the same as or different from the gap for the first undercoat layer and the one or more of the intermediate undercoat layers. In an embodiment, the gap G of one or more of the intermediate layers is larger than the gap G for the first undercoat layer. In this example, the gap G for the final undercoat layer may be (i) smaller than the gap G for the one or more of the intermediate layers, and (ii) the same as or different from the first undercoat layer. In one embodiment, the gap G is the same for the first, intermediate and final undercoat layers.

At 710, the controller 160 controls operation of the gas delivery system 130 and deposits the next undercoat layer. The next under coat layer may be deposited primarily on the ESC 103 and the showerhead 104 or may be primarily deposited on other components within the processing chamber 102. In one embodiment, one or more precursors and one or more dielectric material species are introduced into the processing chamber 102. The precursors may include $SiH_4$, $N_2O$, $N_2$, and/or other suitable precursor. Each dielectric (or undercoat) layer formed during operation 710 may include SiOx, SiNx, SiON, and/or other high-resistive dielectric materials.

In an embodiment, a total of two undercoat layers are deposited on chamber components including the ESC 103 and the showerhead 104. The first undercoat layer is deposited at 706 and the second is deposited at 710. The first undercoat layer may be formed of SiOx or SiON and the second undercoat layer may be formed of SiOx and/or SiNx. In an embodiment, both undercoat layers are formed of SiOx. In yet another embodiment, both of the undercoat layers are formed of SiON. In a further embodiment, the first undercoat layer is formed of SiOx and the second undercoat layer is formed of SION.

In another embodiment, a total of three or more undercoat layers are deposited on chamber components including the ESC 103 and the showerhead 104. The first undercoat layer is deposited at 706 and subsequent undercoat layers are deposited via respective iterations of operation 710. The first undercoat layer may be formed of SiOx or SiON and the subsequent undercoat layers may be formed of SiOx. SiNx or SiON. In another embodiment, all of the undercoat layers are formed of SiOx or SiON. The gap G for the first and third (or last) formed undercoat layers may be the same or different. The gap G for one or more of the intermediate undercoat layers may be larger than the gap G for the first and third (or last) formed undercoat layers. The larger gap is associated with primarily forming an undercoat layer on chamber components other than the ESC 103 and the showerhead 104, although a thin undercoat layer is formed on the ESC 103 and the showerhead 104.

In an embodiment, the undercoat layers formed, during operation 706 and zero or more iterations of operation 710, have an overall thickness T on the ESC 103. The overall thickness may be between the minimum thickness of 7 $\mu m \pm 0.05$ $\mu m$ and the maximum thickness of 15 $\mu m \pm 0.05$ $\mu m$. In one embodiment, the overall thickness T is between 8-12 $\mu m$. In another embodiment, the overall thickness T is between 9-11 $\mu m$. In another embodiment, the overall thickness T is between 7-10 $\mu m$. In another embodiment, the overall thickness T is between 10-15 $\mu m$. In one embodiment, the overall thickness T is 10 $\mu m$. The thicknesses of the formed undercoat layers sum up to the overall thickness T.

In one embodiment, the overall thickness is determined and the above operations are controlled by the controller 160 based on the amount of bowing of the substrate being processed. Bowing can occur, for example, when a substrate includes multiple stacked layers formed of different materials. When the substrate is heated, the different materials can heat up and/or expand at different rates, which can cause bowing. A substrate formed of a single material, such as silicon, may remain flat and have no bowing. The amount of bowing refers to an amount of deflection of a center of the substrate relative to a radially outer peripheral edge of the substrate. The amount of bowing is a difference in vertical position between (i) the center of the substrate, and (ii) a plane extending horizontally and contacting the outer peripheral edge of the substrate. As an example, when there is no bowing and/or the amount of bowing is less than a set amount, then the overall thickness T of the overall undercoat layer provided by the formed undercoat layers during operations 706 and 710 may be between 10-15 $\mu m \pm 0.05$ $\mu m$. As an example, when the amount of bowing is greater than or equal to the set amount, then the overall thickness T may be 7-12 $\mu m \pm 0.05$ $\mu m$ to provide increase electrostatic clamping force. As another example, the set amount may be 3 millimeters (mm), where 0-3 mm is considered a low amount of bowing and greater than 3 mm is considered a high amount of bowing. The set amount may be different for different applications, for example, different substrates, ESCs, etc.

The total deposition time for operations 706, 710 may be between 10-30 minutes, depending on the thickness of the overall undercoat layer. The thicker the overall undercoat layer being formed, the longer the total deposition time. The deposition time is also dependent on the gas compositions, gas flow rates, and gas pressures.

At 712, the controller 160 determines substrate process recipe and process parameters, such as RF power levels, gas flow rates and pressures, gas species being supplied, order and timing of operations performed, etc. This may include selecting a reactive gas (e.g., propene ($C_3H_6$) (also referred to as propylene) or acetylene ($C_2H_2$)) and one or more inert gases (e.g., argon (Ar), helium (He) and nitrogen ($n_2$)) to supply during a following deposition process to form a deposited layer on the substrate. The deposited layer may be formed of carbon.

At 714, the controller 160 processes the substrate. Although FIG. 7 shows a single deposition process, multiple etch and/or deposition processes may be performed during operation 714. At 714A, the substrate is set on the ESC 103 and electrostatically clamped to the ESC 103. At 714B, the controller 160 performs a PECVD process to deposit a deposition layer on the substrate. As an example, a carbon layer may be deposited on the substrate. At 714C, the substrate is removed from the processing chamber 102.

At 716, the controller 160 performs a partial clean process to remove carbon deposits on chamber components in the processing chamber 102. This may include introducing a cleaning species, such as oxygen ($O_2$) to remove the carbon deposits. The partial clean does not remove undercoating deposits and undercoat layers.

At 718, the controller 160 determines whether another substrate is to be processed. If yes, operation 720 is performed, otherwise the method may end at 722. At 720, the controller 160 determines whether a set number (e.g., 100) of substrate deposition processes have been performed. If yes, operation 702 may be performed, otherwise operation 712 may be performed.

FIG. 8 shows a portion 800 of an ESC 802 that include three undercoat layers 804, 806, 808. The undercoat layers 804, 806, 808 have respective thicknesses T1, T2, T3. The undercoat layers 804, 806, 808 provide an overall undercoat layer having an overall thickness T. The overall thickness T may be between 7-15 μm±0.05 μm. The thicknesses T1, T2, T3 may be different. In one embodiment, the thicknesses T1 and T3 are the same and the thickness T3 is less than the thicknesses T1 and T3.

Although three undercoat layers are shown, the ESC 802 may have two or more undercoat layers. When the ESC 802 has two undercoat layers, the second undercoat layer may be thinner than the first undercoat layer. Although a single intermediate undercoat layer 806 is shown, one or more intermediate undercoat layers may be formed.

The examples set forth herein provide an ESC undercoat layer process that includes formation of undercoat layers having thicknesses and resistivity levels, which reduce ESC clamping current levels and ESC surface roughening. The ESC undercoat layer process provides a high-quality dielectric layer that satisfies substrate clamping performance requirements while preventing and/or minimizing arcing and cluster defects. The reduced ESC clamping current reduces attraction of AlFx and reduces degradation of MCAs and other ESC surfaces. The reduced ESC clamping current levels minimize degradation to bodies of ESCs including minimizing degradation to MCAs during deposition processing of substrates. As a result, a state of health of ESCs is improved and lifetimes (or useful life) of the ESCs is extended. Undercoat layers are formed that are more resistant to fluorine attack and provide improved step coverage and mechanical and electrical properties for reduced particle formation and arcing.

The foregoing description is merely illustrative in nature and is not intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems.

The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process.

In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control.

Thus, as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for forming an overall undercoat layer on an electrostatic chuck (ESC), the method comprising:
   determining undercoat parameters;
   performing a full clean process to remove undercoat deposits in processing chamber of substrate processing system; and
   based on the undercoat parameters, performing one or more deposition processes to deposit one or more undercoat layers on the ESC to provide the overall undercoat layer having an overall thickness between 7-15 μm, the one or more undercoat layers providing protection of the ESC during subsequent deposition processing of a substrate on the ESC.

2. The method of claim 1, wherein the undercoat parameters include radio frequency power levels, gas flow rates, gas flow pressures, gas species, and durations of deposition processes.

3. The method of claim 1, wherein the undercoat parameters include a size of a gap between the ESC and a showerhead for each undercoat layer formed during deposition of the one or more undercoat layers.

4. The method of claim 1, wherein the full clean process includes supplying ammonia to the processing chamber.

5. The method of claim 1, wherein the one or more undercoat layers comprise:
   a first undercoat layer; and
   a second undercoat layer disposed on the first undercoat layer.

6. The method of claim 5, wherein each of the first undercoat layer and the second undercoat layer comprises at least one of silicon oxide or silicon nitride.

7. The method of claim 5, wherein the first undercoat layer and the second undercoat layer comprise silicon oxide.

8. The method of claim 5, wherein:
   the first undercoat layer comprises silicon oxide or silicon oxynitride; and
   the second undercoat layer comprises silicon nitride or silicon oxynitride.

9. The method of claim 5, wherein:
   the first undercoat layer comprises silicon oxide; and
   the second undercoat layer comprises silicon nitride or silicon oxynitride.

10. The method of claim 5, wherein the second undercoat layer is thinner than the first undercoat layer.

11. The method of claim 5, further comprising setting a size of a gap between the ESC and a showerhead to be greater for deposition of the second undercoat layer than for deposition of the first undercoat layer.

12. The method of claim 5, further comprising setting a size of a gap between the ESC and a showerhead for deposition of the first undercoat layer and refrain from changing the size of the gap for deposition of the second undercoat layer.

13. The method of claim 1, wherein the one or more undercoat layers comprise:
   a first undercoat layer;
   one or more intermediate undercoat layers disposed on the first undercoat layer; and
   a last undercoat layer disposed on the one or more intermediate undercoat layers.

14. The method of claim 13, wherein:
the first undercoat layer is formed of silicon oxide or silicon oxynitride; and
each of the one or more intermediate undercoat layers and the last undercoat layer is formed of at least one of silicon oxide or silicon nitride.

15. The method of claim 13, further comprising setting a size of a gap between the ESC and a showerhead to be greater for deposition of at least one of the one or more intermediate undercoat layers and the last undercoat layer than for deposition of the first undercoat layer.

16. The method of claim 13, further comprising setting a size of a gap between the ESC and a showerhead for deposition of the first undercoat layer and refrain from changing the size of gap for deposition of the one or more intermediate undercoat layers and the last undercoat layer.

17. The method of claim 1, further comprising, based on an amount of estimated bowing of a substrate to be processed, selecting the overall thickness.

18

18. The method of claim 1, further comprising introducing one or more precursors into the processing chamber for deposition of the one or more undercoat layers, wherein the one or more precursors are selected from silane, nitrous oxide and nitrogen.

19. A substrate deposition method comprising:

the method of claim 1;

supplying current to the ESC to electrostatically clamp the substrate to the ESC;

controlling a gas delivery system and a radio frequency generating system to deposit the one or more undercoat layers on the ESC; and subsequent to forming the one or more undercoat layers on the ESC, performing the deposition processing of the substrate on the ESC.

\* \* \* \* \*